(12) United States Patent
Liu et al.

(10) Patent No.: US 6,811,670 B2
(45) Date of Patent: Nov. 2, 2004

(54) METHOD FOR FORMING CATHODE CONTACT AREAS FOR AN ELECTROPLATING PROCESS

(75) Inventors: Chung-Shi Liu, Hsin-Chu (TW); Chen-Hua Yu, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 258 days.

(21) Appl. No.: 10/002,544

(22) Filed: Nov. 21, 2001

(65) Prior Publication Data

US 2003/0094374 A1 May 22, 2003

(51) Int. Cl.⁷ .......................... C25D 7/12; H01L 21/445
(52) U.S. Cl. ...................... 205/123; 205/182; 205/186; 205/192; 205/205; 205/210; 438/618; 438/622; 438/687
(58) Field of Search .......................... 205/96, 118, 122, 205/123, 157, 182, 186, 192, 205, 210; 438/618, 622, 687

(56) References Cited

U.S. PATENT DOCUMENTS 5,907,785 A * 5/1999 Palagonia ................... 438/613
6,261,433 B1 * 7/2001 Landau ......................... 205/96
6,319,387 B1 * 11/2001 Krishnamoorthy et al. . 205/240
6,596,624 B1 * 7/2003 Romankiw .................. 438/619

* cited by examiner

Primary Examiner—Roy King
Assistant Examiner—William T. Leader
(74) Attorney, Agent, or Firm—Tung & Associates

(57) ABSTRACT

A method for forming electroplating cathode contacts around the periphery of a semiconductor wafer including forming an insulating layer over a conductive layer extending at least around the periphery of a semiconductor wafer substrate; etching a plurality of openings around a peripheral portion of the semiconductor wafer substrate through the insulating layer to extend through a thickness of the insulating layer in closed communication with the conductive layer said conductive area in electrical communication with a central portion of the semiconductor wafer substrate; filling the plurality of openings with metal to form electrically conductive pathways; planarizing the electrically conductive pathway surfaces; and, forming a metal layer over the electrically conductive pathway surfaces to form a plurality of contact pads for contacting a cathode for carrying out an electroplating process.

19 Claims, 1 Drawing Sheet

METHOD FOR FORMING CATHODE CONTACT AREAS FOR AN ELECTROPLATING PROCESS

FIELD OF THE INVENTION

This invention generally relates to electroplating cathode contact areas and more particularly to a method for forming electroplating cathode contact areas with increased strength.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) have difficulty filling increasingly high aspect ratio features, for example, where the aspect ratio exceeds 2:1, and particularly where it exceeds 4:1.

As a result of these process limitations, electroplating or electrodeposition, which has previously been limited to the fabrication of patterns on circuit boards, is now emerging as a preferable method for filling metal interconnects structures such as via openings (holes) and trench line openings on semiconductor devices. Typically, electroplating uses a suspension of positively charged ions of deposition material, for example metal ions, in contact with a negatively charged substrate, as a source of electrons, to deposit (plate out) the metal ions onto the charged substrate, for example, a semiconductor wafer. A thin metal layer (seed layer) is first deposited on the semiconductor wafer and in etched features to provide an electrical path across the surfaces. An electrical current is supplied to the seed layer whereby the semiconductor wafer surface is electroplated with an appropriate metal, for example, aluminum or copper.

One exemplary process for forming a series of interconnected multiple layers, for example, is a dual damascene process. Although there are several different manufacturing methods for manufacturing damascene structures, all such methods employ a series of photolithographic masking and etching steps, typically by a reactive ion etch (RIE). In the typical multilayer semiconductor manufacturing process, for example, a dual damascene process, a series insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multi layer device. Metal interconnect lines typically serve to selectively interconnect conductive regions within a layer of a multilayer device. Vias and metal interconnect lines are selectively interconnected in order to form the necessary electrical connections. In forming a dual damascene structure via openings (holes) and trench line openings are etched into the insulating layers and are back-filled with metal. The insulating layers where metal interconnect lines (trench lines) are formed are typically referred to as metallization layers and the insulating layer including interconnecting vias are referred to as intermetal dielectric (IMD) layers. The IMD layers are preferably a low-k (low dielectric constant) insulating material which reduces signal delay times caused by parasitic capacitance. The process by which via openings (holes) and trench lines are selectively etched into the insulating layers is typically a photolithographic masking process, followed by a reactive ion etch (RIE) process, both of which are commonly known in the art.

In filling the via openings and trench line openings with metal, for example, copper, electroplating is a preferable method to achieve superior step coverage of sub-micron etched features. The method generally includes first depositing a barrier layer over the etched opening surfaces, such as via openings and trench line openings, depositing a metal seed layer, preferably copper, over the barrier layer, and then electroplating a metal, again preferably copper, over the seed layer to fill the etched feature to form, for example, vias and trench lines. Finally, the deposited layers and the dielectric layers are planarized, for example, by chemical mechanical polishing (CMP), to define a conductive interconnect feature.

Metal electroplating in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The plating surface forms the cathode of the plating system such that ions in the plating solution deposit on the conductive portion of the plating surface.

One method for providing power to the plating surface uses, for example cathode contacts (e.g., pins, 'fingers', or springs) which contact the plating surface which includes a seed layer of metal. The cathode contacts make contact with the cathode contact area which includes a seed layer formed as close as possible to the edge (periphery) of the semiconductor wafer to minimize the wasted area on the wafer due to the cathode contact areas. In the prior art, the seed layer in the cathode contact areas at the edge of the wafer have typically been formed over an uppermost insulating (IMD) layer devoid of etched semiconductor features such as vias and trench lines. In order to minimize resistance between the cathode contacts and the cathode contact areas, force is applied to the cathode contacts to assure intimate contact with the seed layer in the cathode contact areas. A shortcoming in the prior art is that, frequently, the electroplating process results in the delamination or peeling of the uppermost insulating (IMD) layers, especially underlying the cathode contact areas, due to the stress induced by the force applied by the cathode contact to the cathode contact area.

The problem is exacerbated by the use of low-k (low dielectric) material in insulating (IMD) layers, for example, carbon doped silicon dioxide. In order to reduce signal delays caused by parasitic effects related to the capacitance of insulating layers, for example, IMD layers, incorporation of low-k materials have become standard practice as semiconductor feature sizes have diminished. Many of the low-k materials are designed with a high degree of porosity to allow the achievement of lower dielectric constants. A shortcoming of using porous low-k materials in insulating layers is that the insulating layers have reduced strength and are prone to delamination (peeling) and cracking when they are subjected to processing stresses, for example, stresses induced by the forces applied by electroplating cathode contacts.

There is therefore a need in the semiconductor processing art to develop a method whereby insulating layers are strengthened in the electroplating cathode contact area on a semiconductor wafer surface thereby avoiding delamination or peeling of the insulating layers.

It is therefore an object of the invention to provide a method for strengthening insulating layers in an electroplating cathode contact area on a semiconductor wafer surface while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method.

In a first embodiment according to the present invention, is provided a method for increasing the strength of an electroplating cathode contact area on a semiconductor wafer including the steps of providing a semiconductor wafer comprising a periphery portion and a central portion said central portion comprising at least one insulating layer including a plurality of etched openings in closed communication with an underlying conductive area for filling with metal to form interconnecting conductive pathways; forming a metal seed layer over the central portion; providing a plurality of cathode contact areas within the periphery portion of the semiconductor wafer said cathode contact areas comprising a cathode contact area insulating layer including a plurality of cathode contact area etched openings in closed communication with an underlying conductive region in electrical communication with the metal seed layer; filling the of cathode contact area etched openings with metal to form cathode contact area metal interconnects in electrical communication with the underlying conductive region; planarizing an exposed surface of the cathode contact area metal interconnects; and, forming a conductive layer over the cathode contact area metal interconnects to form a plurality of cathode contact pads for contacting a cathode for carrying out an electroplating process.

In a related embodiment, the method further includes a step prior to the filling step of depositing a barrier layer to cover at least the cathode contact area etched opening sidewalls and floors. Further, the barrier layer includes tantalum, tantalum nitride, titanium nitride, and combinations thereof.

In another related embodiment, the metal seed layer, the cathode contact area metal interconnects, and the contact pads comprise copper or an alloy thereof.

In another embodiment, the cathode contact area metal interconnects include at least one of vias and trench lines.

In yet another related embodiment, the cathode contact area insulating layer comprises an insulating layer with a dielectric constant of less than about 3.0.

In yet a further embodiment, the cathode contact pads form a rectangular area from about 50 microns to about 150 microns on a side.

In another embodiment, the periphery portion is disposed within an exclusion region extending along a circumferential edge of the semiconductor wafer. Further, the exclusion region extends from the circumferential edge of the semiconductor wafer toward the central portion by a radial distance of from about 1 mm to about 3 mm.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method and apparatus according to the present invention is more clearly described by referring to FIGS. 1A–1D, FIG. 2, and FIGS. 3A–3C.

Figure 1A:
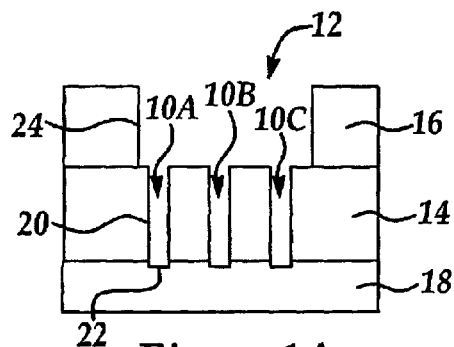
FIGS. 1A–1D depict cross sectional side view representations of a portion of a dual damascene structure at different stages of manufacture.

FIG. 1A, depicts a cross-sectional representation of a portion of a typical dual damascene structure. Although FIG. 1A shows a portion of a typical dual damascene structure, it is understood that such structures may be repeated in spaced relationship across a portion of a semiconductor wafer and repeated in multiple layers to create a multilayer active device area. Further, the semiconductor wafer may consist of several active device areas forming individual chips located in a central portion of the wafer.

Referring to FIG. 1A, in a typical dual damascene structure via openings 10A, 10B, 10C and trench line openings 12 are formed in an intermetal dielectric (IMD) layer 14 and metallization layer 16, respectively. Typically, trench line opening may overlie one or more via openings. Both the IMD layer 14 including the via openings 10A, 10B, 10C and the metallization layer 16 including the trench line opening 12 are preferably formed of a low-k (low dielectric constant material), for example, carbon doped silicon dioxide, with a dielectric constant of less than about 3.0. The IMD layer 14 and the metallization layer 16 are typically formed by conventional CVD processes including PECVD, with the IMD layer 14 typically about 8000 Angstroms in thickness and the metallization layer typically about 5000 Angstroms in thickness. The via openings 10A, 10B, 10C and trench line opening 12 are typically formed by two photolithographic patterning and reactive ion etch (RIE) steps. The via openings 10A, 10B, 10C and trench line opening 12 are back filled with a metal, for example, copper, to form conductive interconnects that will provide an electrical connection with, for example, the underlying conductive feature 18. The via openings, e.g., 10A, include via walls 20 and a via floor 22 exposing at least a portion of the conductive feature 18. The trench line opening 12 is typically formed over the via openings and includes trench walls 24.

Between (IMD) layer 14 and metallization layer 16, there are typically formed an etch stop layer (not shown), preferably silicon nitride (SiN), and a dielectric antireflective coating (DARC) layer (not shown), preferably silicon oxynitride (SiON), for reducing undesirable light reflections in the photoresist masking process to define, for example, via openings.

Figure 1B:
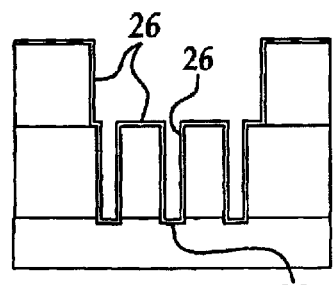

Referring to FIG. 1B, prior to filling the via openings 10A, 10B, 10C, and trench line opening 12 with, for example, copper, typically a barrier layer 26 of, for example, tantalum or tantalum nitride (TaN) is substantially conformally deposited over the via openings and trench line opening to cover the via floor 22, via walls 20, and trench walls 24. The barrier layer is formed to prevent diffusion of the fill metal, for example, copper, into the insulating IMD layer 14 and metallization layer 16. The barrier layer is preferably formed of tantalum or tantalum nitride, however other barrier layers such as titanium, titanium nitride and combinations thereof may also be used. In addition, the barrier layer may be silicided by a conventional process. The deposition process used may be PVD, CVD, or PECVD, such processes being well known in the art. The barrier layer typically has a thickness between about 25 Angstroms and about 400 Angstroms.

Figure 1C:
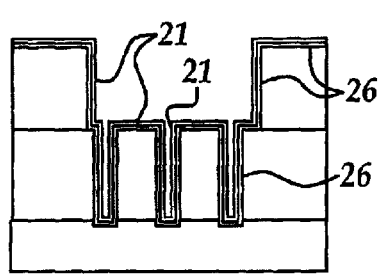

Prior to performing an electroplating process to fill the via openings 10A, 10B, 10C and trench line opening 12 with a metal, for example, copper, referring to FIG. 1C, a copper seed layer 21 is deposited over the barrier layer 26. Other metals, particularly noble metals, can also be used for the seed layer. The copper seed layer 21 provides good adhesion for subsequently electrodeposited metal layers, as well as a substantially conformal layer for substantially conformal plating of the electro deposited metal layer thereover. The copper seed layer 21 is deposited over the active areas included in a semiconductor wafer and provides an electrically conductive layer for a cathodic reaction in an electroplating process where metal ions in an electroplating solution are deposited out of solution onto the copper seed layer 21. The copper seed layer is fully covered on the wafer. The copper seed layer 21 may be formed by a conventional CVD or physical vapor deposition (PVD) process. The thickness of the seed layer 21 varies between about 1000 angstroms and 4000 angstroms depending upon varying process constraints (contact aspect ratio and thermal constraints) and IC product types.

Figure 1D:
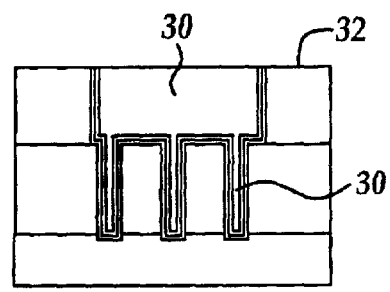

Referring to FIG. 1D, a copper layer 30 is electroplated over the copper seed layer 28 to completely fill the via openings 10A, 10B, 10C and trench line opening 12. Following the electroplating process, the exposed copper is then planarized, preferably by chemical mechanical polishing (CMP). During the planarization process, portions of the copper layer 30, copper seed layer 28, barrier layer 20, and dielectric layer 16 are removed from the upper surface 32 of the structure, leaving a fully planar surface including vias and trench lines as shown in FIG. 1D.

In performing the electroplating process, power to the semiconductor wafer plating surface is supplied by cathode contacts (e.g., pins, 'fingers', or springs) which contact copper pads overlying cathode contact areas located at the periphery region of the semiconductor wafer.

Figure 2:
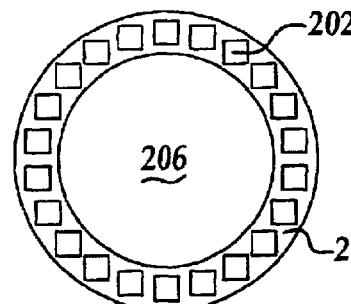
FIG. 2 is a top view of a semiconductor wafer showing the cathode contact pads according to the present invention.

According to the present invention, the cathode contact areas preferably include a plurality of copper pads surrounding the periphery of the semiconductor wafer. The cathode contact areas are preferably a rectangular area of about 50 to 150 microns on a side and more preferably a 100 micron by 100 micron square area. Referring to FIG. 2, exemplary cathode contact areas 202 are shown surrounding a periphery portion 204 (exclusion region) of a semiconductor wafer 200. Inside the periphery portion 204 of the semiconductor wafer is a central portion 206 including active device areas. Preferably the cathode contact areas 202 are located at the periphery portion 204 of the semiconductor wafer 200 to include the entire circumference of the semiconductor wafer 200. Preferably, the periphery portion 204 has a radial dimension that is at least sufficient to accommodate a rectangular cathode contact area including dimensions of about 50 to about 150 microns on a side, but more preferably is from about 1 mm to about 3 mm in radial dimension.

According to the present invention, the cathode contact areas include vias and/or trench lines, preferably filled with copper, formed in an insulating (IMD) layer underlying the copper pads. By the use of the term copper herein is meant copper or alloys thereof. The vias and/or trench lines are in electrical contact with an underlying conductive layer, also preferably copper. The cathode contact area is in electrically conductive communication with the central portion of the semiconductor area which includes the active devices, for example dual damascene structures, as discussed with reference to FIGS. 1A–1D, including a seed layer.

Figure 3A:
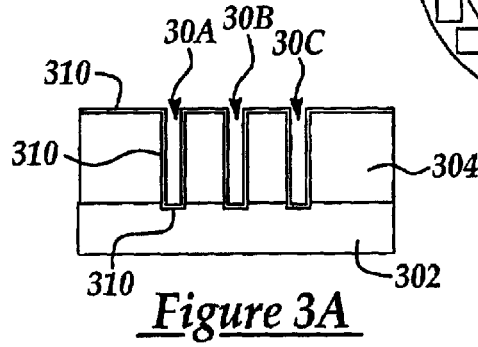
FIGS. 3A–3C are cross sectional side view representations of a portion of a cathode contact area at different stages of manufacture according to the present invention.

Referring to FIG. 3A, is an enlarged cross-section of a portion of the cathode contact area at a stage in the process according to the present invention. Conductive layer region 302, for example copper, underlies an insulating (IMD) layer 304, in which etched openings 306A, 306B, 306C, are formed within the insulating layer 304. The etched openings e.g., 306A, 306B, 306C (cathode contact area etched openings) may be either via openings and/or trench line openings as discussed with reference to FIGS. 1A–1D. Preferably, however, the etched openings are formed in a single layer damascene structure as shown in FIG. 3A as opposed to a dual damascene structure, but are formed using the same general process steps for forming vias and trench lines (metal interconnects) as discussed with reference to FIGS. 1A–1D. It will be appreciated that the etched openings may form a dual damascene structure, but more preferably, via openings and trench line openings are formed in a single insulating (IMD) layer (cathode contact area insulating layer) adjacent to one another as shown in FIG. 3A. The etched openings may include only via openings or only trench line openings, but more preferably include both via openings and trench line openings.

Further, the insulating layer 304 is preferably formed with a low-k dielectric having a dielectric constant of less than about 3.0, and is formed by conventional CVD deposition processes including PECVD or HDPCVD. The etched openings e.g., 306A, 306B, 306C, including via openings and/or trench line openings are formed by a conventional reactive ion etch (RIE) process. In addition, a barrier layer 310 is preferably substantially conformally deposited over the etched openings e.g., 306A, 306B, 306C, to cover at least etched opening sidewalls, and etched opening floors, prior to filling with copper as discussed with reference to via openings and trench lines in FIG. 1B. Further, the barrier layer may be a thin layer, typically 15 Angstroms to 50 Angstroms in thickness, of tantalum nitride, titanium nitride, or silicided versions thereof.

Figure 3B:
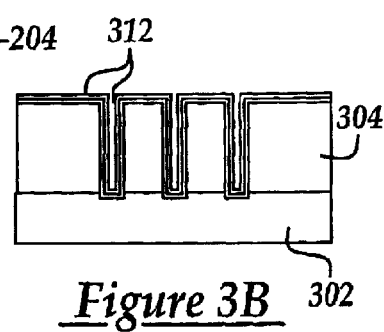

Referring to FIG. 3B, the etched openings, e.g., 306A, 306B, 306C, may have a metal seed layer 312, for example copper, formed substantially conformally over the barrier layer 310 to facilitate electrodeposition of a metal, for example copper, to fill in the etched openings e.g., 306A, 306B, 306C, to form vias and/or trench lines. Alternatively, the etched openings e.g., 306A, 306B, 306C, may be filled with conventional PVD, CVD or metal flow processes.

Following the metal filling of the etched openings e.g., 306A, 306B, 306C, the cathode contact area is planarized according to a conventional CMP process, leaving a fully planar surface with metal interconnects including vias and/or trench lines (cathode contact area metal interconnects).

Figure 3C:
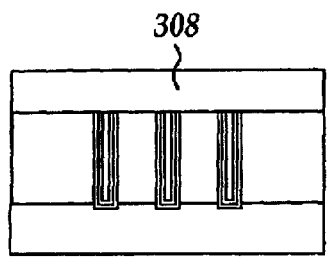

Following planarization, referring to FIG. 3C, copper pads e.g., 308 are formed over the cathode contact areas by conventional photolithographic masking, etching, and PVD or CVD processes, or may be formed by an electrodeposition process. The copper pads 308 are preferably deposited with a thickness ranging from about 1000 Angstroms to about 4000 Angstroms. The cathode contact areas may be formed in parallel with active device area features in the central portion of the semiconductor wafer or may be formed separately therefrom.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for increasing the strength of an electroplating cathode contact area on a semiconductor water to prevent insulating layer delamination comprising the steps of:
    providing a semiconductor wafer comprising a periphery portion and a central portion comprising active chip portions;
    providing a plurality of cathode contact areas within an exclusion region at the periphery portion of the semiconductor wafer excluding active chip portions said cathode contact areas comprising a cathode contact area insulating layer including a plurality of cathode contact area etched openings in closed communication with an underlying conductive region;
    filling the cathode contact area etched openings with metal to form cathode contact area metal interconnects in electrical communication with the underlying conductive region for electrical communication with a metal seed layer comprising the central portion;
    planarizing an exposed surface of the cathode contact area metal interconnects; and,
    forming a conductive layer over the cathode contact area metal interconnects to form a plurality of cathode contact pads for contacting a cathode for carrying out an electroplating process.

2. The method of claim 1, further comprising the step prior to the filling step of depositing a barrier layer to cover at least the cathode contact area etched opening sidewalls and floors.

3. The method of claim 2, wherein the barrier layer includes tantalum, tantalum nitride, titanium nitride, and combinations thereof.

4. The method of claim 1, wherein the metal seed layer, the cathode contact area metal interconnects, and the contact pads comprise copper or an alloy thereof.

5. The method of claim 1, wherein the cathode contact area metal interconnects comprise at least one of vias and trench lines.

6. The method of claim 1, wherein the cathode contact area insulating layer comprises an insulating layer with a dielectric constant of less than about 3.0.

7. The method of claim 1, wherein the cathode contact pads form a rectangular area from about 50 microns to about 150 microns on a side.

8. The method of claim 1, wherein the exclusion region comprises a circumferential edge of the semiconductor wafer extending about 1 mm to about 3 mm toward a central portion of the semiconductor wafer.

9. The method of claim 1, wherein the plurality of cathode contact pads are disposed to include the entire circumference of the semiconductor wafer.

10. The method of claim 1, wherein the cathode contact pads are formed to provide electrical communication through the underlying conductive region with a metal seed layer formed over the central portion.

11. The method of claim 10, wherein the metal seed layer comprises a portion of a damascene structure.

12. A method for forming electroplating cathode contacts around the periphery of a semiconductor wafer comprising the steps of:
    forming an insulating layer over a conductive layer comprising an exclusion region excluding active chip portions at a periphery portion of a semiconductor wafer substrate;
    etching a plurality of openings within the the exclusion region through the insulating layer to extend through a thickness of the insulating layer in closed communication with the conductive layer said conductive layer in electrical communication with a central portion of the semiconductor wafer substrate comprising active device areas;
    filling the plurality of opening with metal to form electrically conductive pathways;
    planarizing the electrically conductive pathway surfaces; and,
    forming a metal layer over the electrically conductive pathway surfaces to form a plurality of contact pads for contacting a cathode for carrying out an electroplating process on a central portion of the semiconductor wafer comprising a damascene structure and a metal seed layer in electrical communication with the conductive layer.

13. The method of claim 12, further comprising the step prior to the filling step of depositing a barrier layer to cover at least sidewalls and floors within the plurality of openings.

14. The method of claim 13, wherein the barrier layer includes tantalum, tantalum nitride, titanium nitride, and combinations thereof.

15. The method of claim 12, wherein the conductive pathways and the plurality of contact pads are selected from the group consisting of copper, aluminum, and tungsten.

16. The method of claim 12, wherein the conductive pathways comprise at least one of vias and trench linen.

17. The method of claim 12, wherein the insulating layer comprises an insulating layer with a dielectric constant of less than about 3.0.

18. The method of claim 12, wherein an individual contact pad forms a rectangular area from about 50 microns to about 150 microns on a side.

19. The method of claim 12, wherein the plurality of contact pads are disposed along a circumferential edge of the semiconductor wafer.

* * * * *